(12) United States Patent
Gale

(10) Patent No.: US 6,437,580 B1
(45) Date of Patent: Aug. 20, 2002

(54) CABLE CONTINUITY TESTER AND TRACER

(76) Inventor: Robert Gale, 3941 Myrtle Ave., North Highlands, CA (US) 95660

( * ) Notice: Subject to any disclaimer, the term of this patent is extended or adjusted under 35 U.S.C. 154(b) by 0 days.

(21) Appl. No.: 09/439,478

(22) Filed: Nov. 12, 1999

Related U.S. Application Data

(60) Provisional application No. 60/108,304, filed on Nov. 13, 1998.

(51) Int. Cl.[7] ................................................ G01R 19/00
(52) U.S. Cl. ........................ 324/555; 324/508; 324/542
(58) Field of Search ................................ 324/542, 508, 324/555, 66, 67, 133

(56) References Cited

U.S. PATENT DOCUMENTS

| | | | | |
|---|---|---|---|---|
| 3,979,193 A | * | 9/1976 | Hayes | 324/507 |
| 4,670,709 A | * | 6/1987 | Iredale | 324/542 |
| 4,740,745 A | * | 4/1988 | Sainz | 324/133 |
| 4,839,599 A | * | 6/1989 | Fischer | 324/542 |
| 5,285,163 A | * | 2/1994 | Liotta | 324/508 |
| 5,612,616 A | * | 3/1997 | Earle | 324/72.5 |

* cited by examiner

Primary Examiner—N. Le
Assistant Examiner—Vincent Q. Nguyen
(74) Attorney, Agent, or Firm—William S. Bernheim

(57) ABSTRACT

A cable continuity tester and tracer includes a cylindrical barrel housing a battery, a cable connector with two contacts, a bicolor LED and a detachable, tone-generating portion. A circuit board in continuity with the battery, LED and both contacts of the connector permits the LED to glow read upon encountering a short in a tested cable, and to glow green upon encountering a low-resistance terminator on the cable of from 50 to 75 ohms. The tone generating portion issues an audible signal when placed on an opposite end of a cable from the tester, when the cable has good continuity.

31 Claims, 10 Drawing Sheets

| CIRCUIT BOARD MATERIALS | | | |
|---|---|---|---|
| PART NO. | DESCRIPTION | VENDOR | VENDOR CODE |
| U1 | Bare Board Fab | National | LM78L05ACM |
| U2 | 2 Terminal Pos. Regulator | National | LMC6762. SOT-8 |
| R1 | Dual Upwr Rrin CMOS Comp | FAI | any |
| R2 | Resistor 150 ohm | FAI | any |
| R3 | Resistor 100 ohm | FAI | any |
| R4 | Resistor 1K ohm | FAI | any |
| R5 | Resistor 470 ohm | FAI | any |
| R6 | Resistor 390K ohm | FAI | any |
| R7 | Resistor 1M ohm | FAI | any |
| R9 | Resistor 470K ohm | FAI | any |
| R11 | Resistor 1M ohm | National | MMBT2222A |
| Q1 | 2N2222, SOT-23 | any | |
| P1 | RA Pin. 025 sq | Mill-Max | 3104-2-00-21 |
| P2 | F-Pin | | 00-00-08-0 |
| P3-4 | Circuit Ground Wire 30 ga. | PGG | any |
| D1 | LED | Liteon | LTL-14CHJ |

FIG. 5

CABLE CONTINUITY TESTER AND TRACER

This application claims the benefit of U.S. provisional application No. 60/108,304, filed Nov. 13, 1998.

BACKGROUND OF THE INVENTION

1. Field of the Invention

The present invention relates generally to devices for testing and tracing electrical circuits; and, it relates more specifically to devices for identifying and continuity-testing cables and cable networks.

2. Description of the Related Art

Coaxial cables and cable systems are essential to the function of telephone systems; cable television (CATV) systems; security systems; closed-circuit television (CCTV) systems; local and wide area computer networks (LANs and WANs); and, other multi-node, and multi-user systems. Tracing individual cables through such systems, and confirming their electrical continuity, often causes significant problems. Cables are often not identified with corresponding tags, labels or color-coding at both ends, so technicians installing or testing pre-wire systems, or removing, repairing or re-routing the cables of an existing system, have to sort through and test each cable individually. This commonly entails sorting through a number of upstream cable ends at a junction box or panel, and testing each against individual downstream termini where they connect to separate televisions, workstations, security sensors, or the like.

In tracing a coaxial cable from its downstream terminus back to the junction box, a technician normally secures a short circuit or low-resistance cable terminator to the downstream terminus of the desired cable and then, back at the junction box, connects a volt-ohm meter (VOM) to each upstream cable end, one-by-one. All cables but the correct one will produce a substantially infinite resistance reading, while the desired cable will show continuity. If the standard a 75-ohm terminator is used at the downstream terminus, a 75-ohm resistance reading on the meter confirms that no mid-cable short is present. Proceeding one-by-one through a great number of cable ends is a very tedious, laborious process. And, it is even more difficult and time-consuming if the technician desires to determine which of a multitude of downstream termini is associated with a particular upstream end at the junction box. In that case, the technician must either affix a terminator to the upstream end and walk room-to-room or workstation-to-workstation connecting a VOM to each downstream terminus, searching for continuity. Or, the technician must connect the VOM to the upstream end of the desired cable at the junction box and, repeatedly, walk to a downstream terminus; connect a terminator; and, walk back to the junction box to read the meter.

Various devices have been used and proposed for more convenient testing and tracing in coaxial cable systems. Miniaturized, limited-purpose versions of VOMs having cables, probes, clips, adaptors, LED's, tone generators and streamlined cases are commonly available, but they are generally difficult to use among tangled masses of cable ends, and more often suited to toolbox rather than pocket transport. Even the smaller, simpler versions have significant drawbacks. For example, U.S. Pat. No. 4,864,225 issued to Long, et al. shows a cylindrical, battery-operated cable tester with a cable coupling on one end for axial, threaded engagement with a cable end, further including a continuity-indicating LED at the end opposite the cable coupling. A conventional cable terminator, for placement on a tested cable's opposite end, stores removably on the device's cable coupling. Although the Long, et al. device may be more convenient than meter reading, it would still have drawbacks in that it would be difficult to fit into tight places and to engage its threaded, axial coupling to cable ends. Furthermore, the device's LED is poorly positioned; it is set in a recess at the farthest point possible from the coupling end, which would make it least useful in checking for continuity during the process of engaging the coupling.

Accordingly, it appears there exists a need for an easily manipulable, easy to read device for testing and tracing cables in coaxial cable systems.

SUMMARY OF THE INVENTION

The cable continuity tester and tracer of the present invention is adapted to overcome the above-noted shortcomings and to fulfill the stated needs. It comprises: a body portion having proximal and distal ends; a portable power supply within the body portion; a connector at the body portion's proximal end having first and second contacts; means closely adjacent to the connector for visibly confirming continuity in a circuit; means for establishing a circuit from the first contact, to the power supply, to the visible circuit continuity-confirming means, through the body portion, and to the second contact; means selectively storable in secure engagement with the body portion for audibly confirming continuity in a circuit.

It is an object of the present invention to provide a cable circuit tester and tracer which has a built-in power source, and fits as easily in a shirt pocket as a pen.

It is a further object of the present invention to provide a cable circuit tester which includes a visible continuity indicator placed closely adjacent to the connector to which the cable under test is being coupled.

Yet another object of this invention is to provide a cable circuit tester which is both sized and configured to work in tight spaces.

Yet a further object of the present invention is to provide a cable continuity tester and tracer having a detachable toner unit able to be either press-engaged or threaded into a cable coupling.

Yet a further object of the invention is to provide a cable continuity tester and tracer with circuitry able to discern whether a line is shorted, or fitted with a low-resistance terminator cap.

Still a further object of the present invention is to provide a continuity tester and tracer able to detect both 50 ohm and 75 ohm terminator caps on tested cable lines.

Another object of the present invention is to provide a cable continuity testing and tracing kit, including adaptors for testing telephone lines, computer network lines and other types of cables and cable systems.

Still further objects of the inventive device disclosed herein will be apparent from the drawings and following detailed description thereof.

BRIEF DESCRIPTION OF THE DRAWINGS

FIG. 5 is a table listing the vendors and model numbers of the components of the printed circuit board.

DESCRIPTION OF THE PREFERRED EMBODIMENT

Figure 1:
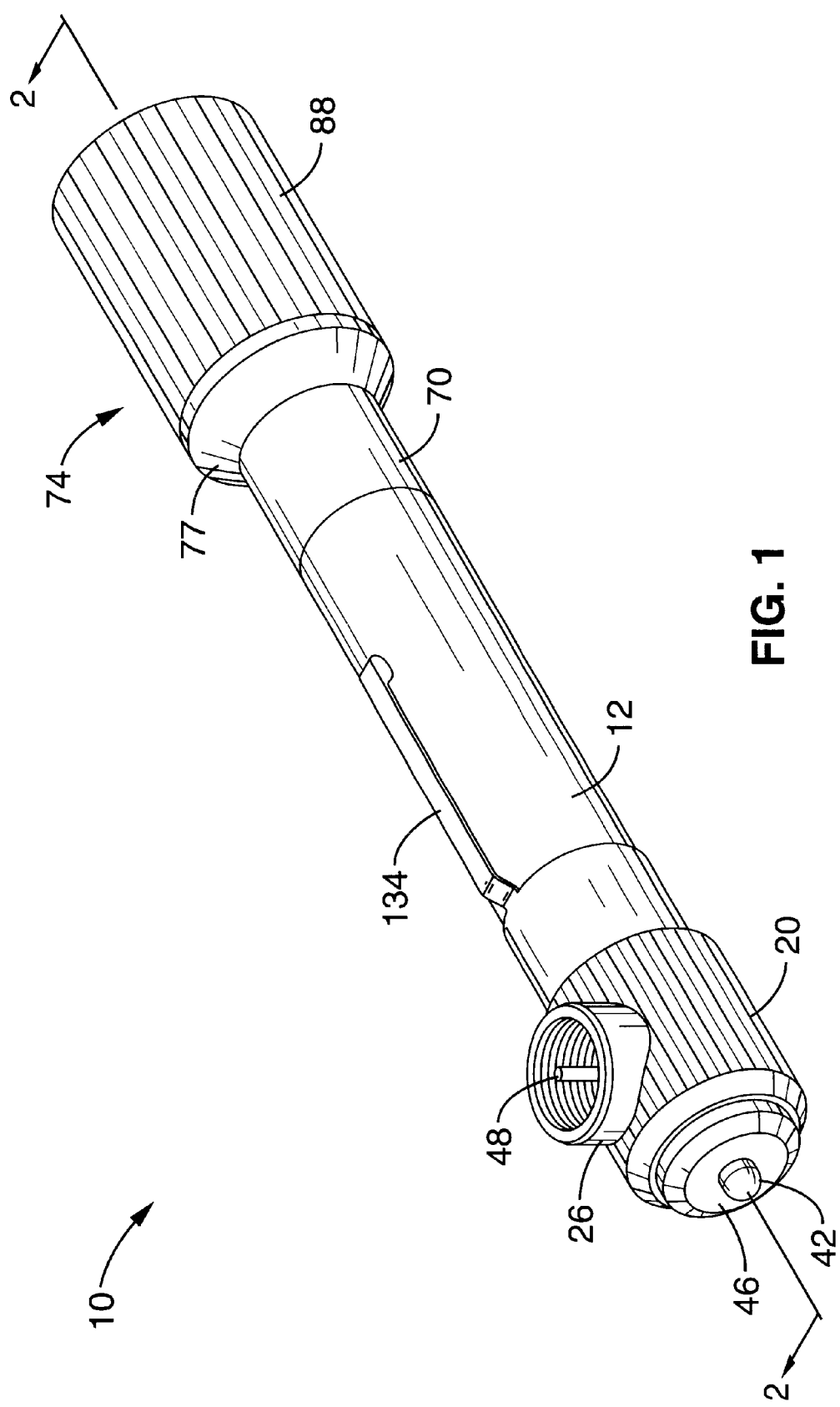
FIG. 1 is a perspective view of the cable continuity testing and tracing device of the invention.
Figure 2:
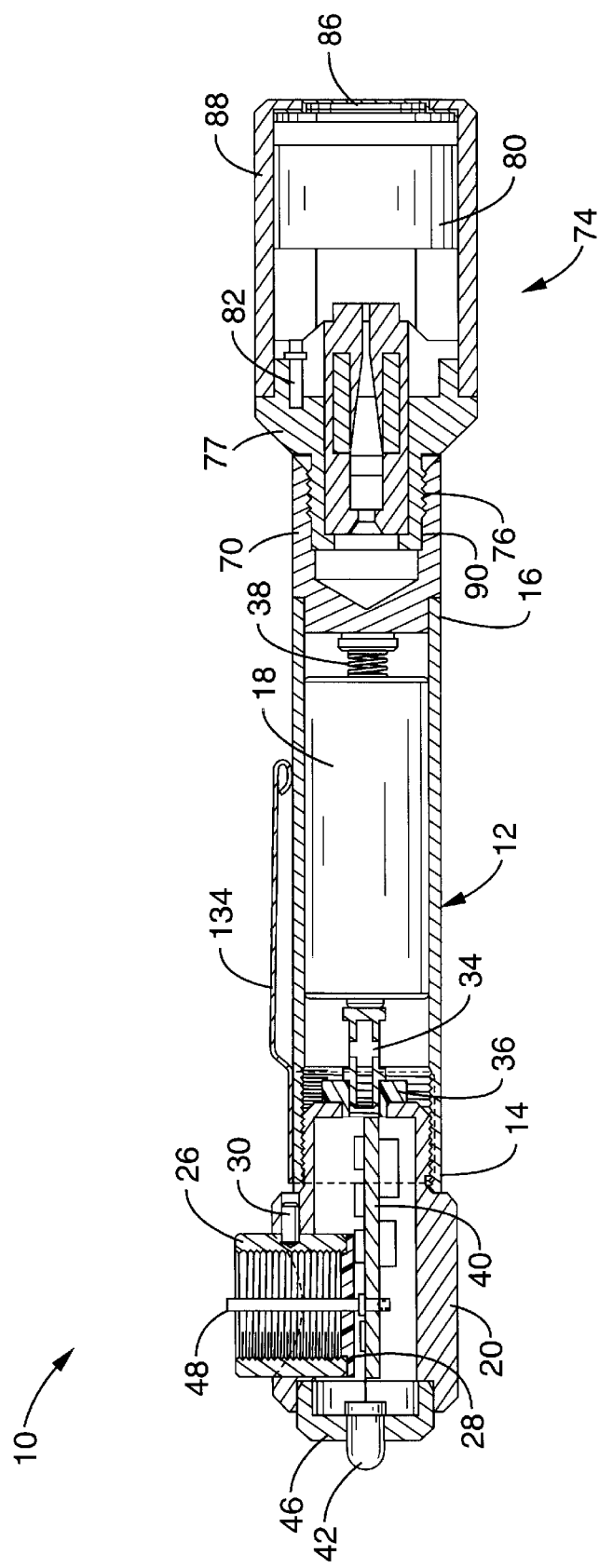
FIG. 2 is cross-sectional view of the device of FIG. 1, taken on line 2—2 of FIG. 1.
Figure 3:
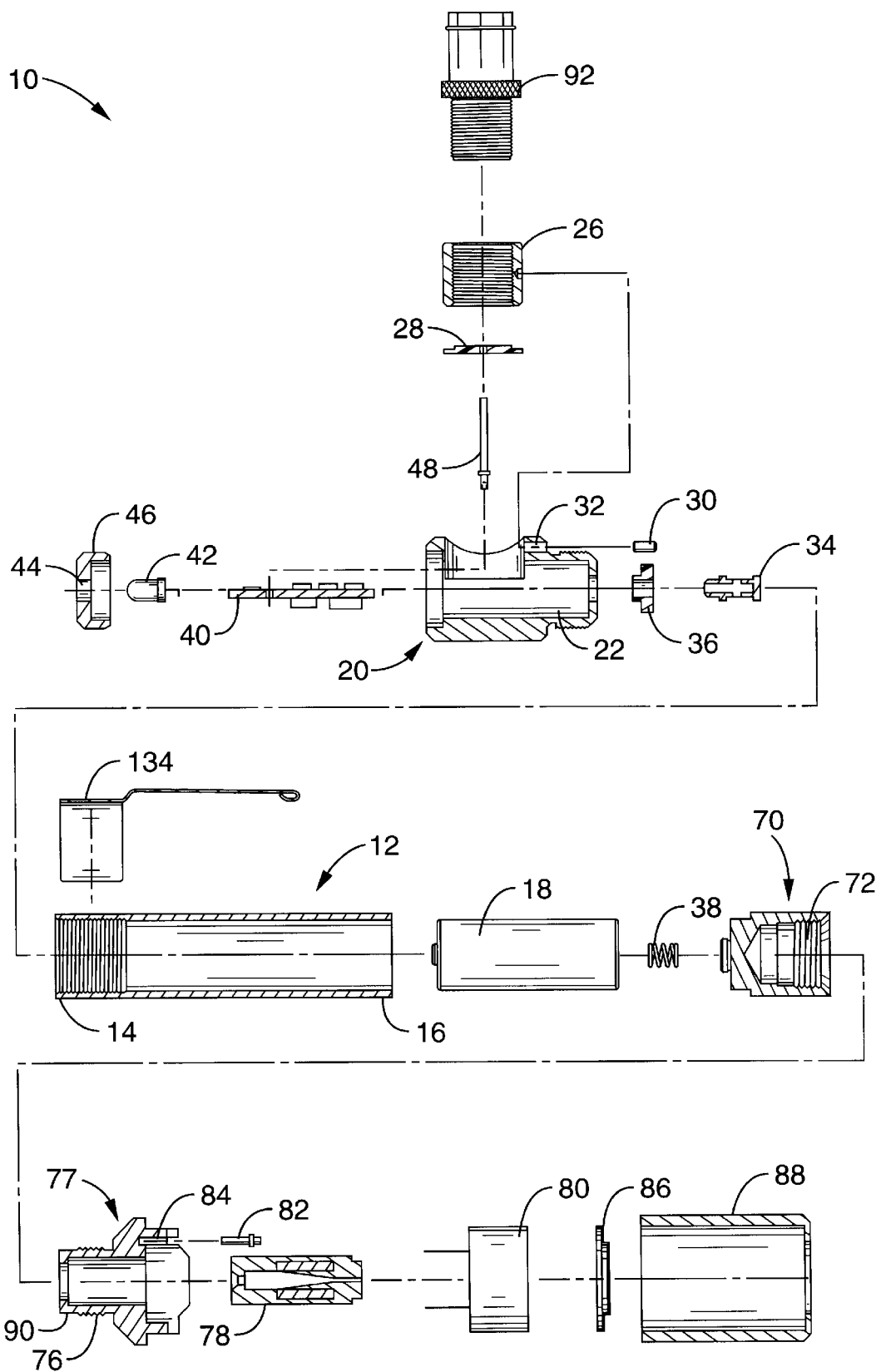
FIG. 3 is an exploded version of the cross-sectional view of FIG. 2.

Referring now specifically to the drawings, FIGS. 1 through 3 show the inventive cable continuity testing and tracing device, which is generally identified herein with the reference numeral 10. Device 10's main body portion is an elongate cylindrical barrel 12 having first and second ends 14 and 16, and housing a 12 volt battery 18.

A cylindrical head portion 20 is threadedly engaged with first end 14 of barrel 12. Head portion 20 has a substantially hollow interior cavity 22, and a circular lateral port 24 oriented on an axis substantially perpendicular to the longitudinal axes of barrel 12 and head portion 20. A cylindrical, internally-threaded bushing 26 is seated in lateral port 24 against circular insulating gasket 28. Bushing 26 is preferably dimensioned to receive a standard, threaded CATV coaxial F-connector. Bushing 26 may be threadedly engaged with head portion 20 at port 24, or may be press-fitted in place. Locking pin is pressed in place through longitudinal channel 32 to keep bushing 26 from disengaging from head portion 20.

A pin connector 34 projects axially from head portion 20 into the first end of barrel 12. Insulating collar 36 holds pin connector securely in place. Battery 18's positive pole abuts pin connector 34, because coil spring 38 biases battery 18 in the direction of barrel 12's first end 14.

Printed circuit board 40 is disposed within head portion 20's interior cavity 22, and is in electrical continuity with pin connector 34. Bicolor LED 42 is also in electrical continuity with printed circuit board 40. Bicolor LED is preferably able to emit red light or green light under different conditions, further discussed below. LED 42's lens projects through an aperture 44 in annular cap 46, cap 46 being pressed into seated, secure engagement with head portion 20 in covering head portion 20's open end. Elongate copper F-pin 48 is in electrical continuity with, and projects perpendicularly from, the face of printed circuit board 40. F-pin projects through lateral port 24, in coaxial alignment with bushing 26.

Figure 4:
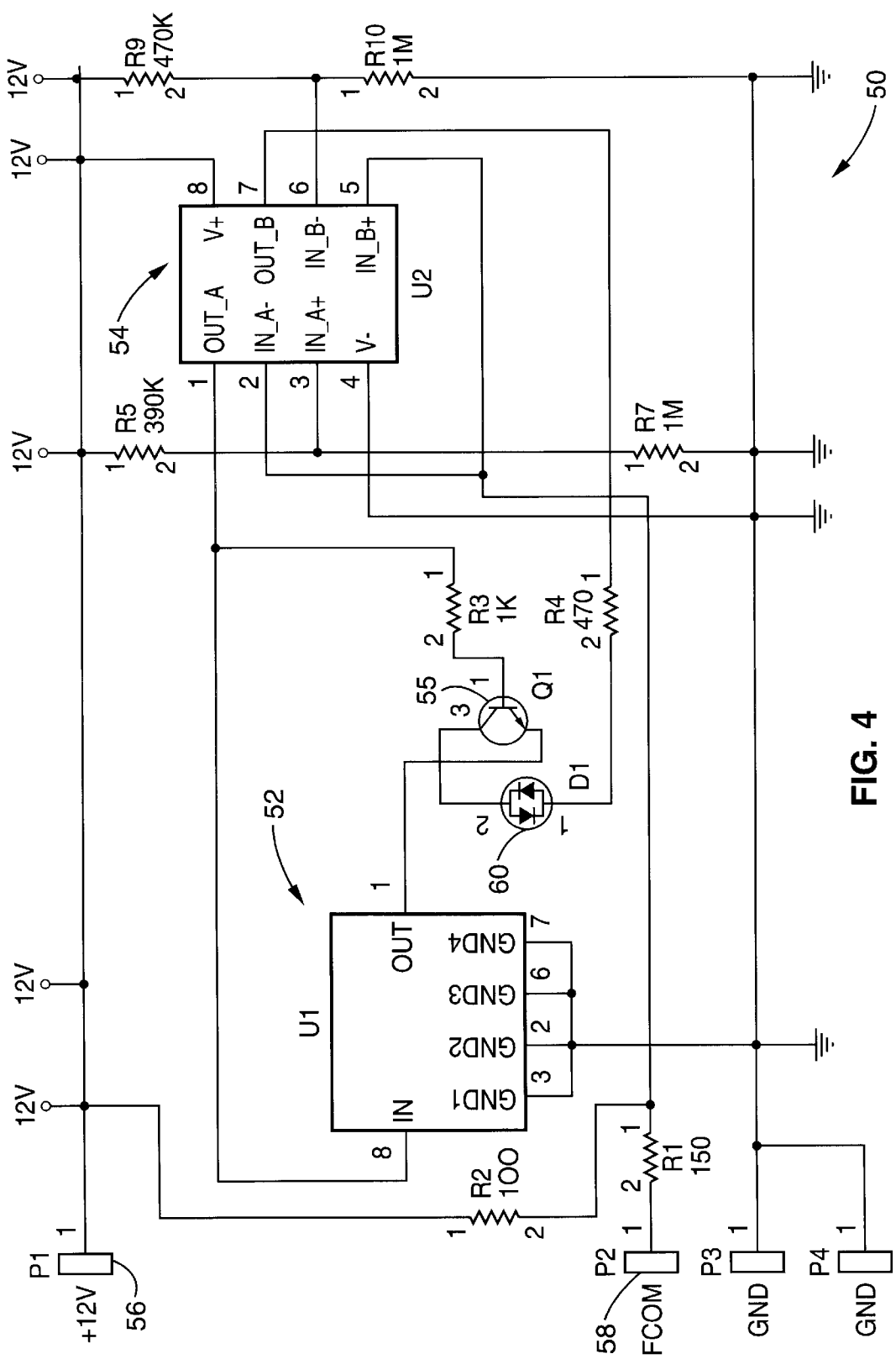
FIG. 4 is a schematic diagram of the electrical circuit on the device's printed circuit board.

Printed circuit board 40 includes the circuit 50 schematically shown in FIG. 4, the components and respective manufacturers of which are shown in the table of FIG. 5. Printed circuit board 40 includes regulator 52, comparator 54 and transistor 55 which, along with resistors of the values shown (not separately numbered herein) carry out the functions of device 10 set forth farther below. P1+12 v connector 56 is in electrical continuity with pin connector 34. P2 FCON connector 58 is in electrical continuity with F-pin 48. D1 LED connection 60 is in electrical continuity with bicolor LED 42.

Electrical continuity exists from F-pin 48 through printed circuit board 40, through LED 42, to pin connector 34, to battery 18 and through the case of device 10 as constructed from barrel 12 and head portion 20. Thus, F-pin 48 and bushing 26 constitute the central and peripheral contacts, respectively, of a standard CATV coaxial cable female F-type connector.

Second end 16 of barrel 12 is closed with end cap 70, which is threadedly secured or pressed into barrel 12. End cap 70 includes a threaded, female F-type connector 72 able to receive a threaded, male F81 connector. However, end cap 70's connector 72 includes no axial electrical contact, and is not in separate electrical continuity with the primary circuit of device 10, other than being part of, and therefore in continuity with, device 10's case.

Toner portion 74 includes a threaded, male F81 CATV cable connector 76 projecting from toner base 77; a standard 2-piece F81 central insert 78; a 12-volt piezo buzzer 80; a ground pin 82 received by ground pin channel 84; piezo protection screen 86 and cylindrical case 88. Piezo buzzer 80 is a 12-volt D.C. unit, model no. EFM-250, manufactured by Ningbo East Electronics Co. Ltd., available through Myntahl Corporation of Hayward, Calif. One of piezo 80's electrodes (not separately numbered) is in continuity with the peripheral, threaded portion of F81 connector 76 on toner base 77. Piezo 80's other electrode is in continuity with central insert 78 of male F81 connector 76. A relieved, nonthreaded portion 90 of male F81 connector 76 is provided at connector 76's extreme terminus.

In use, device 10 is easily manipulable. It can be held in one hand, extended into a tight spot such as a crowded junction box or a mass of cables and, with a bit of finger pressure behind head portion 20, its connector can be pressed into engagement with a cable end. LED 42 is essentially at the end of the technician's fingertip, and therefore easily viewed.

Figure 6:
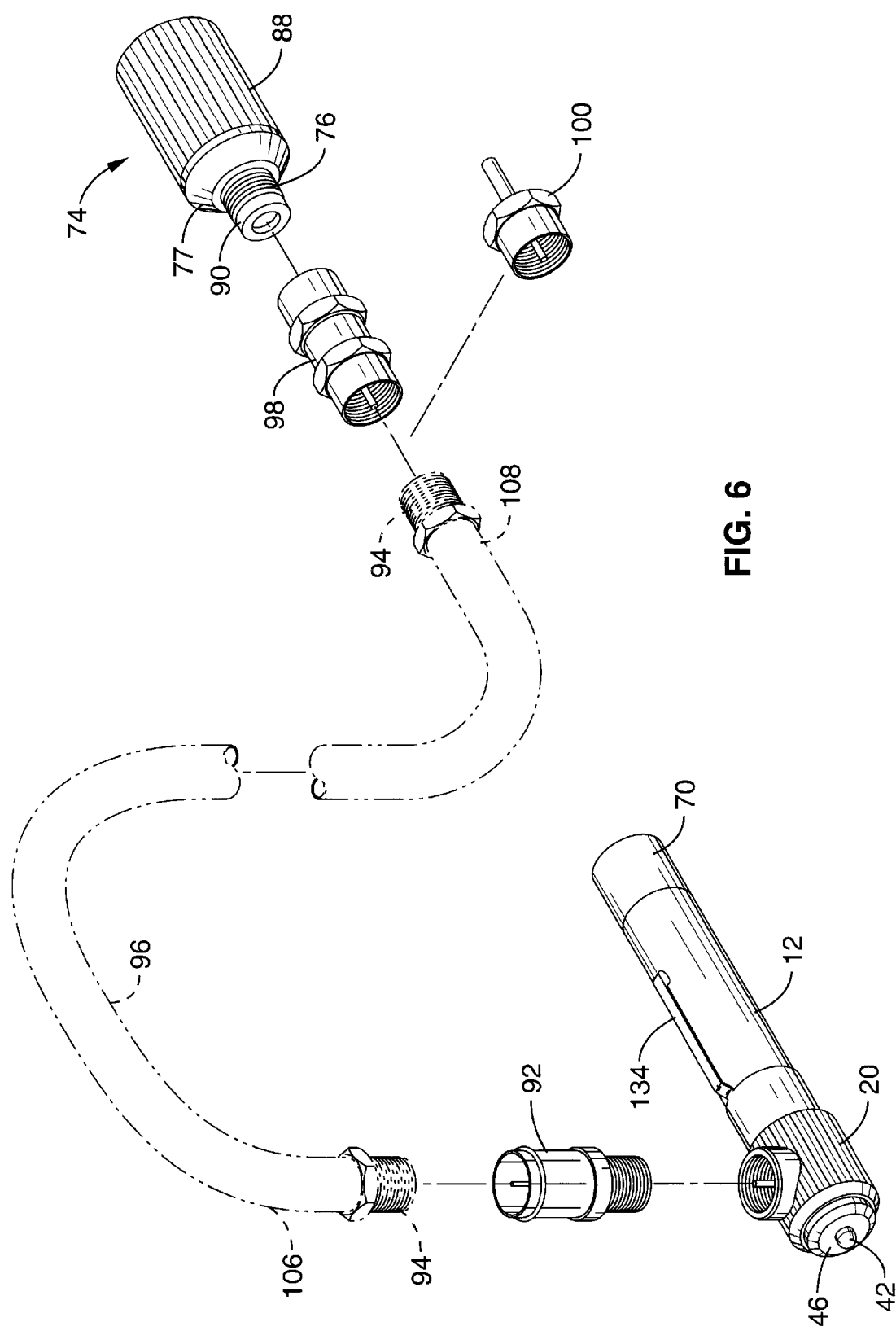
FIG. 6 is an exploded perspective view of the device of the invention in use.

As shown in FIG. 6, device 10 is most conveniently fitted with an F-type push connector 92 at bushing 26 for connecting with a male, threaded F81 connector 94 on the end of a length of coaxial CATV cable 96. Once connector 92 is engaged with male cable end 94, if toner portion 74 is engaged with a female-female, F-type coupling 98, piezo buzzer 80 should emit an audible tone confirming that good continuity exists in the line. If there is a short in the line, piezo buzzer 80 will not sound, and visible confirmation of the short is issued by LED 42 glowing red. If discontinuity exists in the line, no audible confirmation from toner portion 74 is heard, and LED 42 emits no color; it remains clear. Thus, circuit 50 distinguishes between a direct short and the condition of the line when toner portion 74 is in the cable circuit.

If instead, as in FIG. 6, the distal cable end is fitted with a 75 ohm terminator 100, LED 42 on device 10 would flash green, indicating proper termination. That is, where continuity exists, circuit 50 distinguishes the low resistance in the line from a direct short, and also from the condition when toner portion 74 is in the cable circuit, and causes LED 42 to glow green, rather than red.

Figure 7:
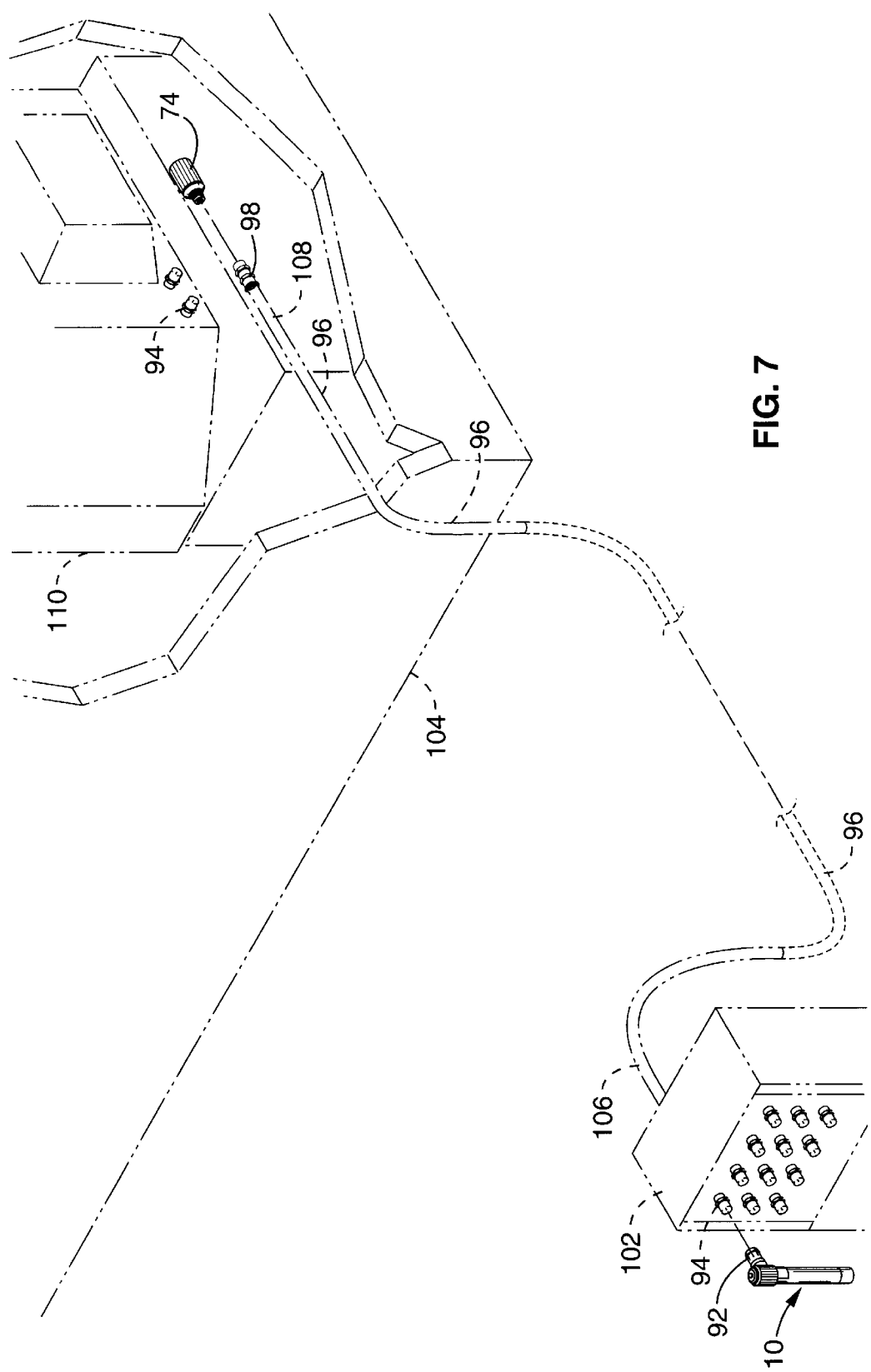
FIG. 7 is a perspective view of the device of the invention in use in testing a cable between a junction box and a television in a room in a dwelling structure.

In the field, use of device 10 may be as depicted in FIG. 7. For example, from junction box 102 outside an individual room 104 in a dwelling structure, in attempting to determine to which distal cable end 108 a particular proximal-end 106 male F81 coaxial cable connector 94 is connected, the technician would first engage device 10's F-type push connector 92 with the proximal-end 106 male F81 connector 94 in question. Then, the technician would enter each room 104 of the structure having a distal cable end 108, and apply toner portion 74 to the threaded, female-female F-type connector 98 normally mated with the male F81 connector on the back of a television set 110. Toner portion 74's relieved threads 90 permit the technician to press toner portion 74 into quick contact with female-female connector 98, listening for the audible confirmation from piezo 80 that continuity exists with device 10 at junction box 102. If no tone is heard, the technician moves to the next cable-supplied room 104, and makes another quick check until the correct cable is found.

Alternatively, the technician may screw toner portion 74 into secure engagement with female-female connector 98 and then, back at junction box 102, test each male F81 jack at each proximal end 106 of each cable 96. Once the technician connects device 10 with the correct connector 94, if the technician is not too far from toner portion 74, an audible tone from piezo 80 will be heard. If there is a splitter in the line, and if the cable branch projecting from the splitter is properly terminated with a 75 ohm splitter, the technician will see a green LED in addition to hearing the audible confirmation from toner portion 74.

In yet another alternative mode of use, where the technician desires to determine which F-type female connector 98 at junction box 102 is connected to distal cable end 108 in room 104, and where distal cable end 108 may be too far from junction box 102 for the technician to hear an audible tone, the technician may affix device 10 to distal end 108 and carry toner portion 74 to junction box 102. In that scenario, the positions of device 10 and toner portion 74 are essentially the reverse of what is shown in FIG. 7. That is, the technician engages device 10's F-type push connector 92 with the distal-end 108 F81 connector in room 104 and leaves it there. Assume, for example, that junction box 102 has multiple F-type female connectors 98 at the proximal ends 106 of cables 96. This is most desirable, as it permits advantageous use of the nonthreaded tip 90 of toner portion 74. At junction box 102, the technician quickly presses toner portion 74 into connection with each female, F-type connector 98 in junction box 102. As soon as an audible tone from piezo 80 is heard, continuity is confirmed. Failure to hear a tone from a particular line indicates that the cable engaged by toner portion 74 is not the cable connected with device 10, or that there is a short in the line. However, if there were a short in the line, the technician would have noticed LED 42 glowing red upon application of device 10 to distal cable end 108.

On other occasions, the technician may need to determine whether particular cables 96 are properly terminated with a 75 ohm terminator cap 100. In that case, the technician needs only to apply device 10 to each proximal end 106 of each cable 96 in question at junction box 102. Upon connection, if LED 42 glows green, proper connection to a 75 ohm terminator cap is confirmed. If a red LED is observed, the technician knows there is either a short in the cable, or that the cable is properly connected to a television 110 or other cable-supplied device. Accordingly, each such cable which produces a red flash should be checked with toner portion 74 at its distal end 108, as described above. If LED 42 does not glow at all, the technician is informed that the line has no short, but that it is not properly terminated and that it is not connected to any television 110 or other cable-supplied device.

Device 10 is also adapted for testing LAN coaxial cable systems. In doing so, an adaptor having a threaded, male F81 connector on one end and a BNC LAN connector on the other is engaged with bushing 26 of device 10. Such F to BNC adaptors (not shown) are known and commonly available. In testing continuity of cables in LAN systems, the same procedure set forth above for CATV systems is followed. However, proper termination of a cable in LAN a system requires application of a standard 50 ohm BNC terminator cap (not shown). Thus, to accommodate LAN as well as CATV systems, circuit 50 of device 10 is adapted to produce a green LED flash if a 50 ohm resistance is sensed in the line. Thus, circuit 50 produces a green LED flash if any resistance from 50 to 75 ohms is encountered, thus giving device 10 great versatility.

Figure 8:
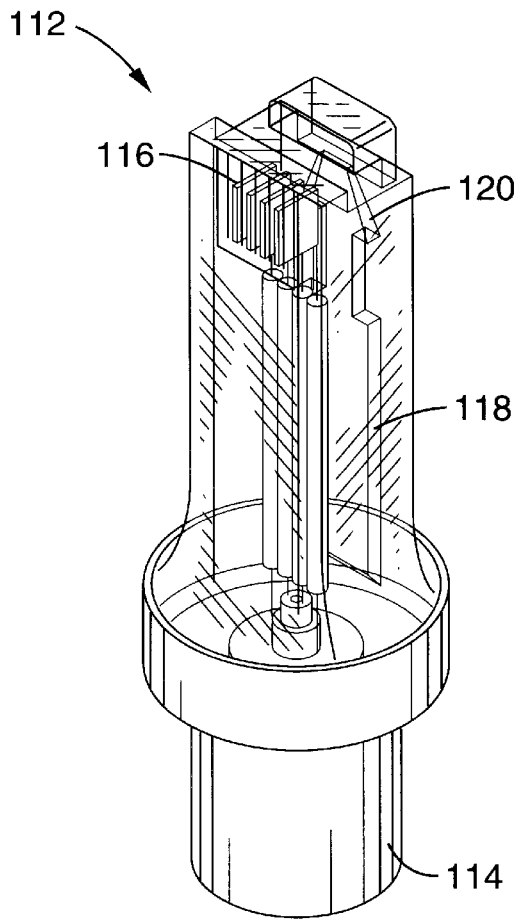
FIG. 8 is a perspective view of an adaptor for mating the device of the invention with an RJ11 telephone connection.
Figure 9:
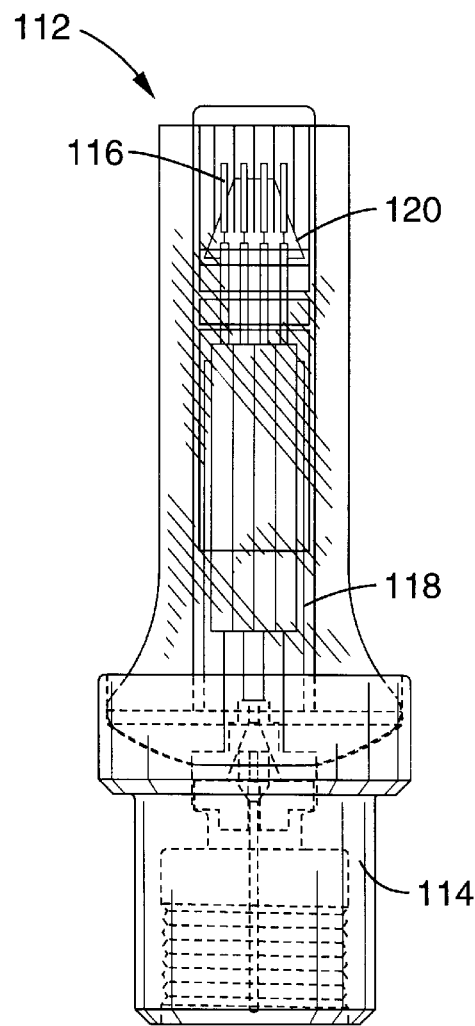
FIG. 9 is side elevation view of the RJ11 adaptor of FIG. 8

Device 10 is given further versatility by addition of a specially-configured telephone system adaptor 112 having a threaded, female F-type connector 114 on one end, and a male RJ11 connector 116 on the other. This special adaptor for testing twisted-pair telephone lines is shown in FIGS. 8 and 9. Male RJ11 connector 116 of adaptor 112 is longer than the standard RJ11 connector, molded of plastic, and has an integrally-molded, finger-depressible spring bar 118 with a barbed tip 120. Two of the four standard RJ11 pins in male RJ11 connector 116 are connected to the center pin of the female F-type connector 114, and two are connected to connector 114's outer, peripheral connector. This permits testing two telephone pairs, i.e. lines, at once. These elements make it very easy for the technician to use telephone system adaptor 112 in conjunction with device 10 when adaptor 112's threaded, female F-type connector is engaged with a male-male, threaded F81 connector to bushing 26. Male RJ11 connector 116 of adaptor 112 is very easily manipulable: it is easy to engage with a female RJ11 receptacle in crowded or obscure areas; it clicks in place and stays put once engaged; and, it is easy to release from the receptacle with a bit of finger pressure on spring bar 118. For audible confirmation of continuity in a line with which device 10 and telephone adaptor 112 are engaged, a second adaptor 112 is attached to toner 74 and plugged into the end of the line opposite to that where device 10 is situated.

Figure 11:
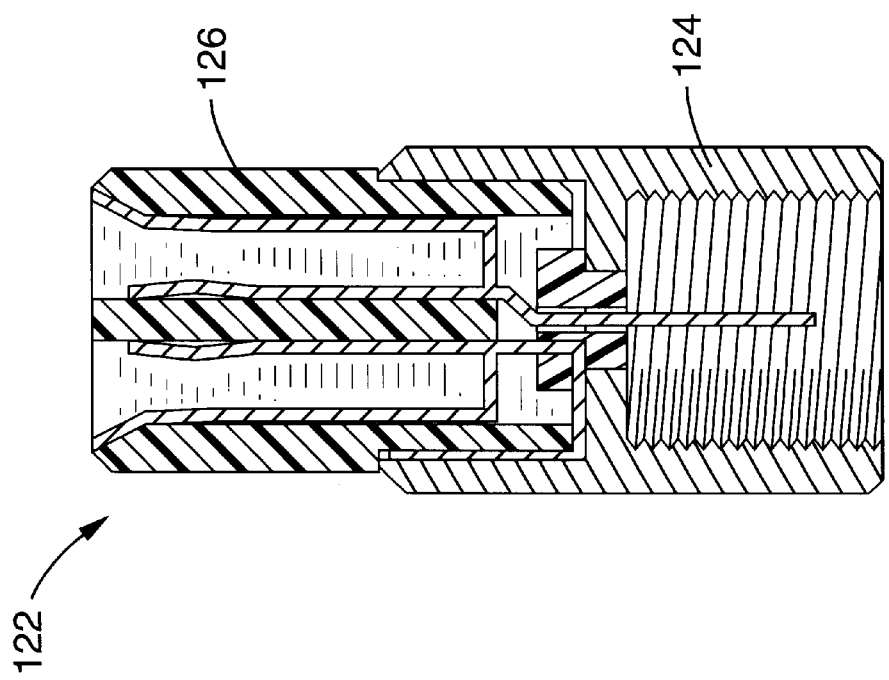
FIG. 11 is a side elevation view of the dual-contact USOC telephone adaptor of FIG. 10.
Figure 10:
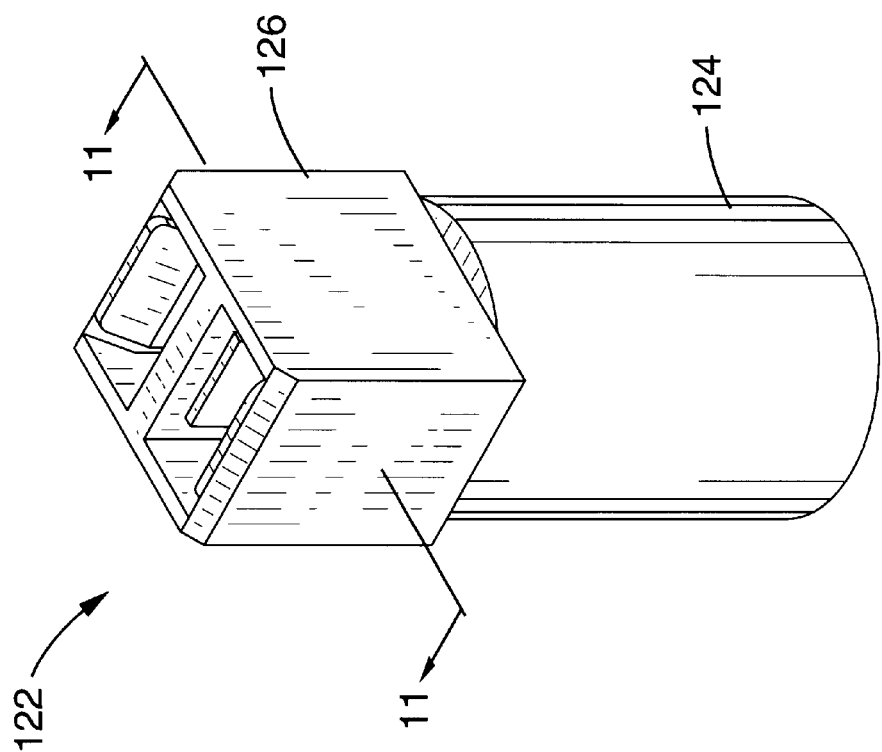
FIG. 10 is a perspective view of an adaptor for mating the device of the invention with a dual-contact USOC telephone connection.

Another telephone system testing device is shown in FIGS. 10 and 11. Therein, a dual-contact USOC adapter 122 for testing a telephone 66 block having up to 50 telephone lines is shown. USOC adaptor includes a threaded, female F-type connector 124 on one side, and a push-type, dual-contact USOC-type connector 126 on the other. One contact of the USOC-type connector 126 is connected to the central pin of the female F-type connector 124, and the other is connected to connector 124's outer, peripheral connector. USOC telephone adaptor 122 may be used alone, or in combination with RJ11 adaptor 112 on the opposite end of a tested line, to confirm continuity.

Figure 12:
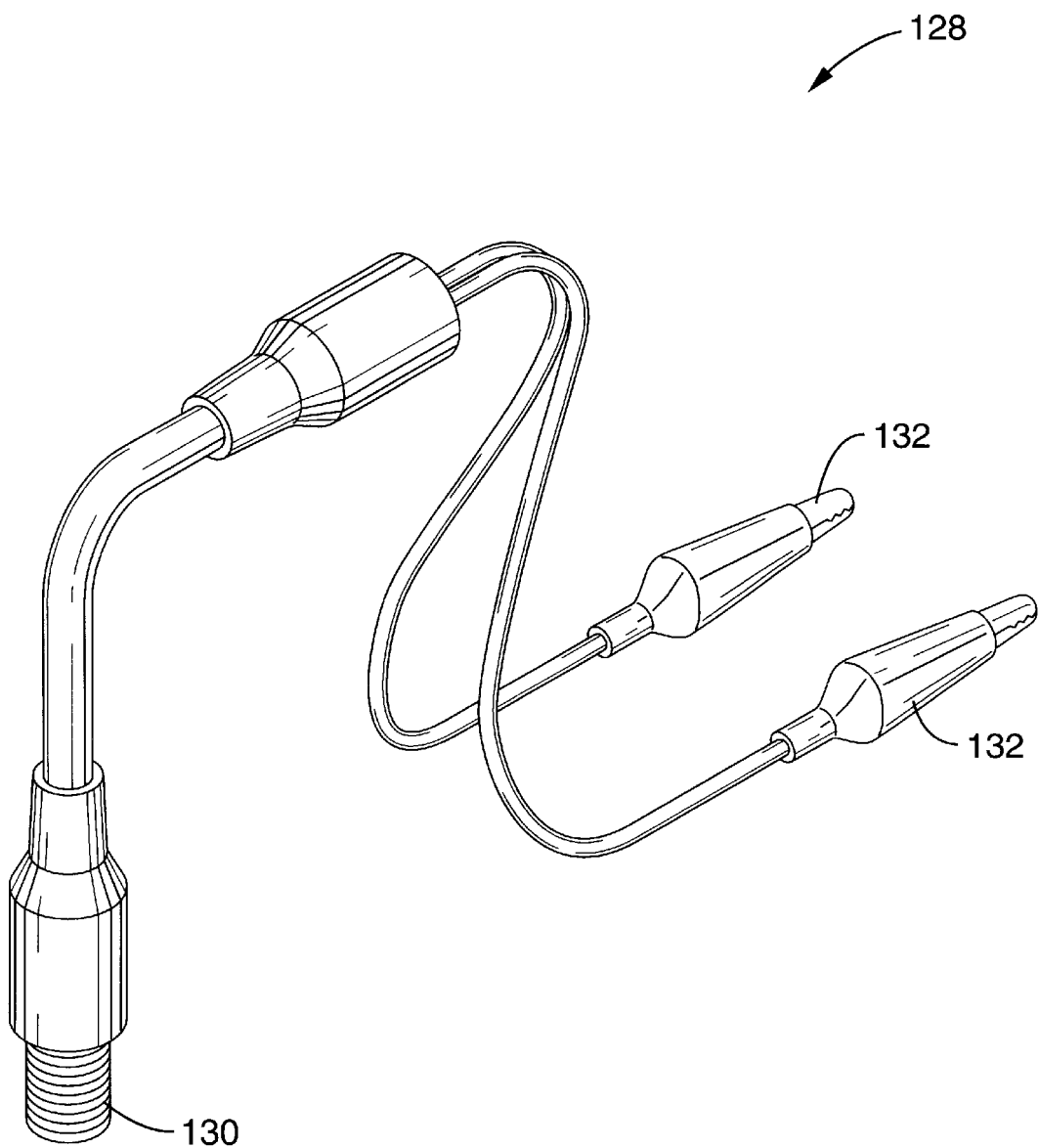
FIG. 12 is a perspective view of an adaptor for mating dual alligator clip leads with the device of the invention.

Finally, for versatility in testing other systems, or where the proper connectors or adaptors for coaxial or twisted pair systems are not immediately available, FIG. 12 shows a clip lead adaptor 128 having a threaded, male F81 connector 130 on one end, and a pair of alligator clip leads 132 on the other. One alligator clip lead 132 is connected to the central pin-receiving channel of the threaded, male F81 connector 130, and the other is connected to connector 128's outer, peripheral connector.

Between uses, device 10's pocket clip 134 facilitates convenient storage in the technician's pocket.

A kit may be assembled from device 10, adaptors 112, 122 and 128, along with various terminator caps and standard couplings and adaptors for the types of systems to be tested. These components may be kept together in any small convenient carrying case.

The foregoing detailed disclosure of the inventive cable continuity testing and tracing device 10 is considered as only illustrative of the preferred embodiment of, and not a limitation upon the scope of, the invention. Those skilled in the art will envision many other possible variations of the structure disclosed herein that nevertheless fall within the scope of the following claims.

And, alternative uses for this inventive device may later be realized. Accordingly, the scope of the invention should be determined with reference to the appended claims, and not by the examples which have herein been given.

I claim:

1. A cable testing and tracing device, comprising:
   a. A body portion having first and second ends wherein said body portion comprises a cylindrical barrel;
   b. a portable power supply within said body portion wherein said power supply comprises a battery within said cylindrical barrel;
   c. a connector, comprising first and second contacts, at said body portion's first end wherein said connector also comprises a head portion at said first end of said body portion wherein said head portion includes a coupling which coaxially engages with said cylindrical barrel, and wherein said connector is oriented and adapted to receive a cable end or adaptor oriented at a right angle to a longitudinal axis of said body portion;
   d. means closely adjacent to said connector for visibly confirming continuity in a circuit;
   e. means for establishing a circuit from said first contact, to said power supply, to said visibly confirming-continuity means, through said body portion, and to said second contact; and
   f. means for storably securing to said body portion a means audibly confirming continuity in a circuit.

2. The device of claim 1, wherein said connector is oriented and adapted to receive a cable end or adaptor oriented at a right angle to a longitudinal axis of said body portion.

3. The device of claim 1, wherein said connector comprises a coaxial connector.

4. The device of claim 1, wherein said first contact comprises a central contact and wherein said second contact comprises a peripheral contact.

5. The device of claim 1, wherein said connector is a push-type connector.

6. The device of claim 1, wherein said connector is an F-type connector.

7. The device of claim 1, further including means at said second end of said body portion for receiving said audible circuit-continuity confirming means.

8. The device of claim 7, wherein said first end comprises a coaxial connector.

9. The device of claim 1, further including a head portion at said first end of said body.

10. The device of claim 9, wherein said head portion includes said connector.

11. The device of claim 9, wherein said head portion includes said visible circuit continuity-confirming means.

12. The device of claim 1, wherein said audible circuit-continuity confirming means comprises a terminator assembly including a speaker.

13. The device of claim 12, wherein said speaker is a piezo-electric element.

14. The device of claim 1, wherein said audible circuit continuity-confirming means comprises a connector having first and second contacts, and a speaker.

15. The device of claim 14, wherein said connector comprises a coaxial connector.

16. The device of claim 14, wherein said first contact comprises a central contact and wherein said second contact comprises a peripheral contact.

17. The device of claim 14, wherein said connector is a threaded connector having a non-threaded terminal end adapted to permit said connector be used in making push-type, as well as threaded, connections.

18. The device of claim 1, further including an adaptor having a first end able to mate securely with, and in circuit continuity with, said connector, said adaptor having a second end able to mate with dual clips on a telephone 66 block.

19. The device of claim 18, wherein said first end comprises an F-type connector.

20. The device of claim 18, wherein said second end comprises a dual contact.

21. The device of claim 1, further including an adaptor having a first end able to mate securely with, and in circuit continuity with, said connector, said adaptor having a second end able to mate with an RJ11 connector.

22. The device of claim 21, wherein said first end comprises a coaxial connector.

23. The device of claim 21, wherein said first end comprises an F-type connector.

24. The device of claim 21, wherein said second end comprises a male RJ11 connector.

25. The device of claim 1, wherein said visible circuit-confirming means comprises an LED.

26. The device of claim 25, wherein said LED is able to emit a plurality of colors.

27. The device of claim 26, further including means for causing said LED to emit a first color corresponding to a first tested circuit condition, and for causing said LED to emit a second color corresponding to a second tested circuit condition.

28. The device of claim 27, wherein said LED emits a first color when a tested circuit is shorted, and wherein said LED emits a second color when a tested circuit is terminated with a low-resistance terminator.

29. The device of claim 27, wherein said LED emits a first color when a tested circuit is shorted.

30. The device of claim 29, wherein said LED emits a second color when a tested circuit is terminated with a low-resistance terminator.

31. The device of claim 30, wherein said second color is emitted when said terminator is approximately 50 to 75 ohms.

* * * * *